United States Patent [19]

Lee

[11] Patent Number: 5,563,091

[45] Date of Patent: Oct. 8, 1996

[54] METHOD FOR ISOLATING SEMICONDUCTOR ELEMENTS

[75] Inventor: Chang-Jae Lee, Chungcheongbuk-do, Rep. of Korea

[73] Assignee: Goldstar Electron Co., Ltd., Cheongju, Rep. of Korea

[21] Appl. No.: 355,393

[22] Filed: Dec. 13, 1994

[30] Foreign Application Priority Data

Dec. 14, 1993 [KR] Rep. of Korea ...................... 93-27563

[51] Int. Cl.⁶ .................................................. H01L 21/76
[52] U.S. Cl. .................................. 437/70; 437/69; 437/18
[58] Field of Search .............. 437/69, 70; 148/DIG. 85, 148/DIG. 86, DIG. 117

[56] References Cited

FOREIGN PATENT DOCUMENTS

| | | |
|---|---|---|
| 62-112344 | 5/1987 | Japan . |
| 130245 | 2/1989 | Japan . |
| 1283854 | 11/1989 | Japan . |
| 268929 | 3/1990 | Japan . |
| 2304927 | 12/1990 | Japan . |
| 4123431 | 4/1992 | Japan . |
| 4151852 | 5/1992 | Japan . |
| 6163528 | 6/1994 | Japan . |
| 2198882 | 6/1988 | United Kingdom . |

OTHER PUBLICATIONS

Minegishi, K., "A New Self Aligned Framed Mask Method for Selective Oxidation", Jap. J. Appl. Phys, vol. 20 (1981) Supplement 20–1, pp. 55–61.

Kuang Y. Chiu, et al.; "The Sloped–Wall SWAMI–A Defect––Free Zero Bird's–Beak Local Oxidation Process for Scaled VLSI Technology"; IEEE Transactions on Electron Devices, vol. ED–30, No. 11, Nov. 1983; pp. 1505–1511.

C. Claeys, et al.; "Structural and Electrical Characterization of SWAMI Techniques for Submicron Technologies"; J. Electrochem, Socl, vol. 136, No. 9, Sep. 1989; pp. 2619–2624.

P. Molle, et al.; "Sealed Interface Local Oxidation by Rapid Thermal Nitridation"; J. Electrochem, vol. 138, No. 12, Dec. 1991; pp. 3722–3738.

B. Davari, et al.; "A Variable–Size Shallow Trench Isolation (STI) Technology with Diffused Sidewall Doping For Submicron CMOS"; IEDM 88; pp. 92–95.

Wolf, S., "Isolation Technologies for Integrated Circuits"; Silicon Processing for the VLSI ERA —vol. II; pp. 20–27, 1990.

*Primary Examiner*—George Fourson
*Attorney, Agent, or Firm*—Alan R. Loudermilk

[57] ABSTRACT

A method for isolating semiconductor regions so that unit elements may be electrically insulated. A disclosed method includes the steps of: forming a pad oxide layer and a nitride layer on a silicon substrate, and forming an active region pattern; exposing the pad oxide to HF to remove a portion of the pad oxide, and depositing polysilicon so that pad oxide as the path for the diffusion of oxygen during the oxidation is not exposed to the oxidizing atmosphere; forming a nitride layer side wall on the side of field region to increase the distance between field oxide region and active region; and carrying out a field channel stop ion implantation after the completion of the first field oxidation and after removing the side wall of nitride layer and before a second field oxidation process.

25 Claims, 4 Drawing Sheets

METHOD FOR ISOLATING SEMICONDUCTOR ELEMENTS

FIELD OF THE INVENTION

The present invention relates to methods for isolating elements during the manufacturing of semiconductor devices.

BACKGROUND OF THE INVENTION

In a MOS (metal oxide semiconductor) device, one of the most important techniques for increasing the device density is the isolation technique. That is, the technique for minimizing the non-active region (field region) for isolating unit elements is very important. Such isolation techniques have progressed from p-n junction isolation techniques for bipolar devices to the LOCOS (local oxidation of silicon) isolation technique which was introduced by E. Kooi and J. A. Appels in 1970. With the LOCOS technique, the densities of MOS devices and bipolar devices have greatly improved.

Meanwhile, the trend in the progress of DRAMs is for technical developments for increasing the density of DRAMs. Particularly, an isolation technique by which the area of the non-active regions can be reduced is a key to the improvement of semiconductor density.

The LOCOS technique has been used with processes having a minimum line width of 1.0 µm (such as a 1 M DRAM) without difficulty. However, with the development of minimum line widths of 0.8 µm (such as with a 4 M DRAM), the limit of the LOCOS method came to be recognized. Efforts for overcoming this difficulty were steadily made until the present time. An example of an improvement to the LOCOS method is the use of trench formed by etching the silicon substrate, with an insulator filled in the trench. This trench isolation technique has not been put to significant practical use, however, due to the technical difficulty involved. Most efforts now are directed to further improvement of the LOCOS isolation technique, and this improved method may be put into mass production.

The trend of improving the LOCOS technique is oriented to minimize the encroachment (bird's beak) of the oxide into the active region during oxidation. As illustrated in FIG. 1, in the general LOCOS method, bird's beak 16, which is caused by side oxidation, is grown in an elongated manner during the field oxidation along pad oxide layer ($SiO_2$) 14, which is the under-layer of nitride layer 12. Further, the impurity which is implanted during the field ion implantation diffuses into the active region (where elements are to be formed), thereby reducing the area of the active region.

In an attempt to overcome the above described problems, as illustrated in FIG. 2, efforts were made to inhibit the growth of the bird's beak, which is caused by the oxidation along pad oxide layer ($SiO_2$) 24 (which is an under-layer of nitride layer 21). That is, polysilicon buffer layer 23 is inserted between $SiO_2$ layer 24 and nitride layer 21, which is the oxidation mask. This is the so-called polysilicon buffered LOCOS method, which was proposed in 1988 (IEDM, p. 100).

In addition to the above methods, a "SILO" method has been proposed (sealed interface local oxidation, 1988, IEEE Transaction Electron Devices, p. 96), and as well as a "SWAMI" (side wall masked isolation) method. With such improved methods, however, there remain problems to be solved.

In the case of the polysilicon buffered LOCOS, field oxide bird's beak 26 is reduced to some degree, but, when gate line formation and metallization are carried out after the LOCOS method, the formation of a pattern having a certain resolution on a photo resist is difficult due to the fact that the upper portion (the portion which is projected from the silicon substrate) of the field oxide is very large. Further, the field oxide cannot be formed deeply from the surface of the substrate, and, therefore, the channel length of the parasite field transistor is shortened, with the result that the punch-through characteristics are lowered, and the isolation feature is affected.

Meanwhile, in the case of the SWAMI isolation method, the problem of the bird's beak does not occur, but there are many problems in carrying out the method itself. That is, difficulties are encountered in etching the silicon substrate in an inclined form, whether a wet etching or a dry etching is applied. In the case of wet etching, an aqueous alkaline solution such as KOH or NaOH is used. In this method, the etching is possible only at a certain angle depending on the crystallization of the substrate, and, therefore, there is no slope control ability. For example, in the case of a 100 wafer, the etching is made at an angle of 45° in the direction of 110, while $K^+$ and $Na^+$ ions contaminate the silicon substrate. In the case of dry etching, there are problems in controlling uniformity of the slope and repeated uniform formation.

In addition, there also are serious problems in the conventional LOCOS method. That is, the width and length of the active region are reduced so as to be suitable for a high density device, but the thickness of the field oxide is not reduced, and a heat cycle which is the same as that of the conventional method has to be retained. Further, a high concentration ion implantation has to be carried out for stably maintaining the punch-through voltage on the short channel isolating space. Therefore, the high concentration dopant of the field region diffuses sidewardly into the active region as with other conventional techniques and, therefore, the real reduction of the width of the active region becomes the same as that of conventional techniques. In accordance with the increase of the density, however, the active width in the design is very much reduced based on the design rule. (For example, the width of the active region for a 64 M DRAM is 0.4 µm). The sideward diffusion amount ΔW of the active region channel stop dopant relative to the width of the active region has resulted in a considerable loss of the width of the active region compared with conventional techniques. For example, as illustrated in FIG. 3, in the case where the semiconductor device has a designed active width W of 0.4 µm and a length L of the active region, even if the amount ΔW is 0.1 µm, the diffusion encroachment occurs at opposite sides and, therefore, the relation is formed 0.4–2ΔW =0.2 µm. In the conventional LOCOS process, however, if field oxide having a thickness of 5000 Å is formed, the value of ΔW is estimated to be 0.15 to 0.2 µm. Therefore, if the active width is reduced, the flow of current through the source and drain is restricted. Consequently, the performance of the transistor is deteriorated due to the lowering of the current driving capability and the rise of the threshold voltage.

Therefore, as described above, the conventional LOCOS method has many problems to be solved.

SUMMARY OF THE INVENTION

The present invention is intended to overcome the above described disadvantages of the conventional LOCOS method.

Therefore, it is an object of the present invention to provide a method for isolating elements in a semiconductor device in which the LOCOS technique is improved such that the bird's beak encroachment into the active region is reduced, and the diffusion of the channel stop ion implantation dopant in the field region is reduced.

In the present invention, during the growth of the bird's beak on the field oxide layer, a pad oxide layer which plays the role of a path is kept from being exposed, and the field oxidation is carried out by dividing it into two stages, so that the bird's beak growth time and the dopant diffusion time should be shortened, thereby reducing the bird's beak and the distance of dopant encroachment.

In achieving the above object, a first embodiment of the method for isolating unit elements to electrically insulate them according to the present invention includes the steps of: forming a pad oxide layer and a nitride layer on a semiconductor substrate; defining an active pattern by anisotropically etching the portion of the pad oxide layer and the nitride layer where an active region is to be formed; carrying out a wet etching on the pad oxide layer between the silicon substrate and the nitride layer to remove a certain amount from the edge of the active pattern; forming a silicon layer on the whole surface so as to fill the vacant space where the pad oxide layer had been removed in the preceding step; depositing a silicon nitride layer thereupon; anisotropically etching the silicon nitride layer to form a side wall of silicon nitride layer on the sides of the silicon layer which has been deposited on the active pattern; carrying out a field oxidation for oxidizing the exposed silicon layer and the silicon substrate to form a first field oxide layer; removing the side wall of the silicon nitride layer, and carrying out a field channel stop ion implantation; and carrying out a field oxidation process to form a second field oxide layer.

In a second embodiment of the present invention, first a silicon nitride side wall is formed as with the first embodiment of the present invention. Then, a field channel stop ion implantation is carried out prior to forming a first field oxide layer. A field oxidation is carried out to oxidize the exposed silicon layer and the silicon substrate, thereby forming a first field oxide layer. Then the side wall of the silicon nitride layer is removed and, then, a field oxidation is carried out again to form a second field oxide layer.

The first and second field oxide layers are formed by adjusting their thicknesses to the optimum size.

After formation of a side wall of the silicon nitride layer, the exposed portion of the silicon layer is etched, and then, the next steps are carried out.

A pad oxide layer and a nitride layer are formed on a silicon substrate and, a part of the pad oxide layer is etched from its side by dipping into HF. Polysilicon is deposited, so that the pad oxide which serves as the path for the diffusion of oxygen should not be exposed to the oxidizing atmosphere. Further, the oxidizing time is shortened, so that the horizontally growing bird's beak should be made as small as possible. Further, in order to reduce the amount of $\Delta W$, a channel stop ion implantation is carried out at a step (to be described below) after etching the side wall, so that the distance between the ion implantation region and the active region should be enlarged. Alternatively, the channel stop ion implantation may be carried out after completion of the first field oxidation, and before removal of the field nitride layer and before the conduction of the second side wall oxidation. Thus, the fact that the dopant diffusion distance is proportionate to $Dt^{1/2}$ (where D represents a diffusion coefficient, and t represent the oxidation time) is utilized, so that the oxidizing time should be reduced, thereby minimizing the amount of $\Delta W$.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

Figure 1:
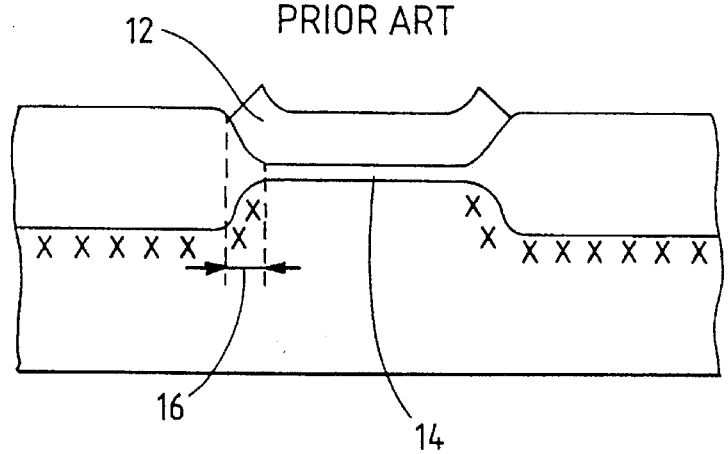
FIG. 1 is a partly sectional view of a semiconductor device illustrating a conventional LOCOS process.
Figure 2:
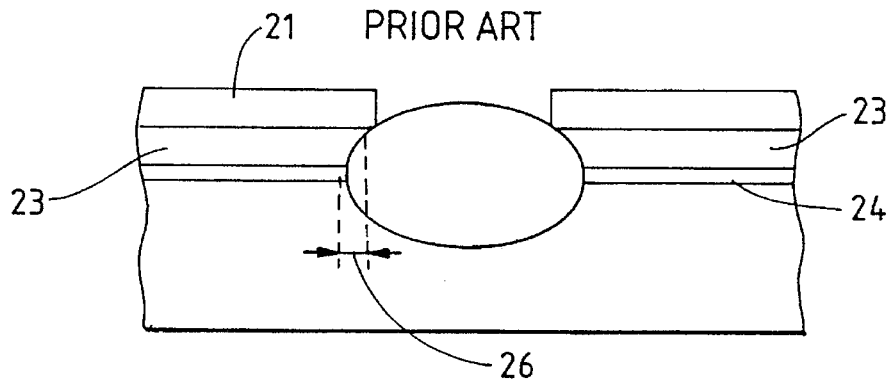
FIG. 2 is a partly sectional view of a semiconductor device illustrating another conventional LOCOS process.
Figure 3:
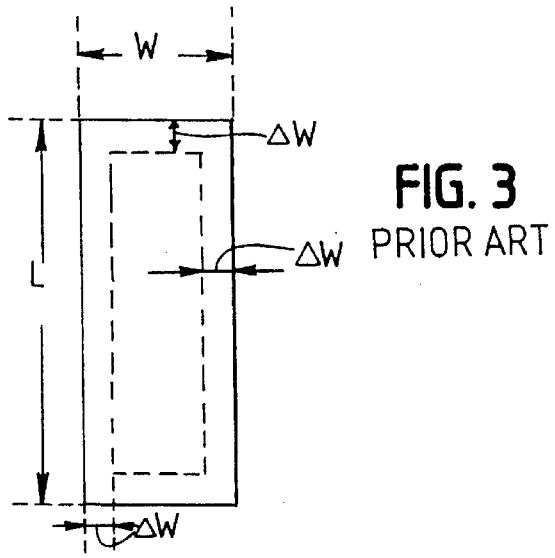
FIG. 3 is a plan view of an active region formed by the conventional LOCOS process.
Figure 4A:
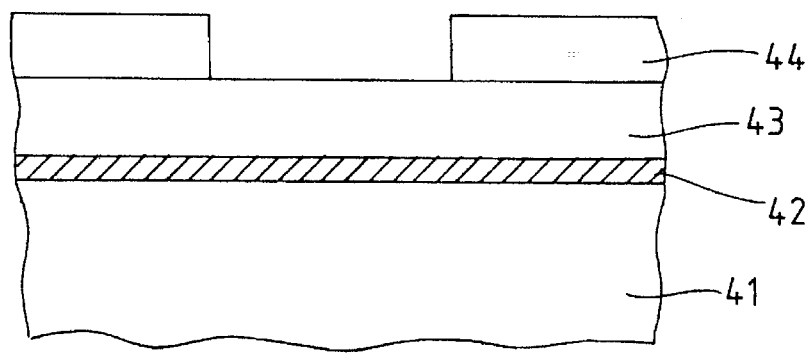
FIGS. 4A to 4I are partly sectional views of a semiconductor device illustrating methods according to the present invention.

Preferred embodiments of the present invention will be described referring to FIGS. 4A to 4I First, as illustrated in FIG. 4A, in accordance with the intended device (such as PMOS, NMOS, or CMOS), pad oxide layer ($SiO_2$) 42 is formed by oxidizing silicon substrate 41 to about 500 Å, and silicon nitride layer 43 is formed to about 2000 Å by using a low pressure CVD (LPCVD) apparatus based on a conventional method.

A conventional photolithography technique is applied to define an active region and non-active region and to form an active pattern. That is, photo resist is coated, and photo resist mask 44 is formed by exposing and developing the photo resist using an active photo mask.

Figure 4B:
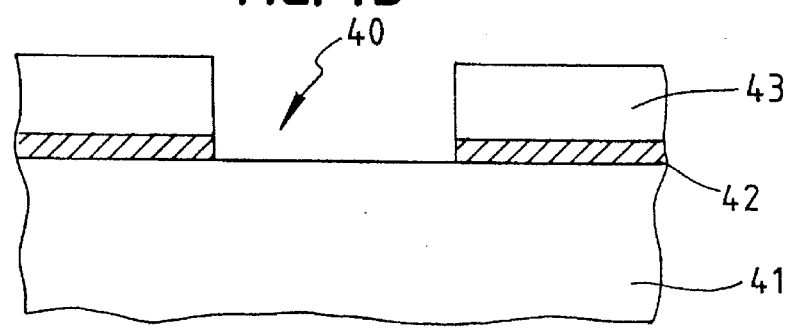

As illustrated in FIG. 4B, utilizing this photo resist mask, silicon nitride layer 43 and pad oxide layer 42 are etched to form field pattern 40, and photo resist mask 44 is removed by dipping into an $H_2SO_4/H_2O_2$ solution.

Figure 4C:
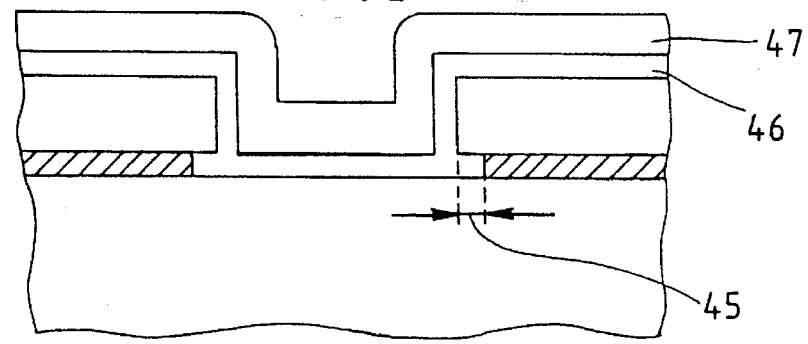

As illustrated in FIG. 4C, the structure is dipped into a 50:1 aqueous HF solution (or, as an alternative, an aqueous $NH_3$ solution) to etch pad oxide layer 42 ($SiO_2$) (lying under nitride layer 43) by a certain amount 45 of about 1000 Å. Then, undoped polysilicon 46 is deposited to about 550 Å using an LPCVD method, and $Si_3N_4$ layer 47 is deposited to about 1800 Å thereupon.

Figure 4D:
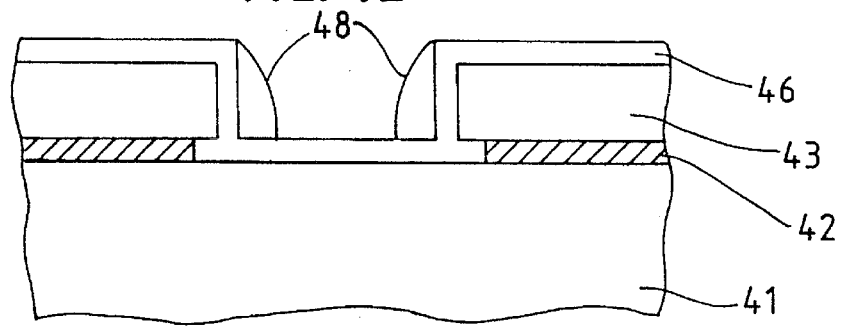

As illustrated in FIG. 4D, $Si_3N_4$ layer 47 is etched using $CHF_3/CF_4$ and applying an RIE (reactive ion etching) process, thereby forming $Si_3N_4$ side wall 48 on the sides of the active pattern.

Figure 4E:
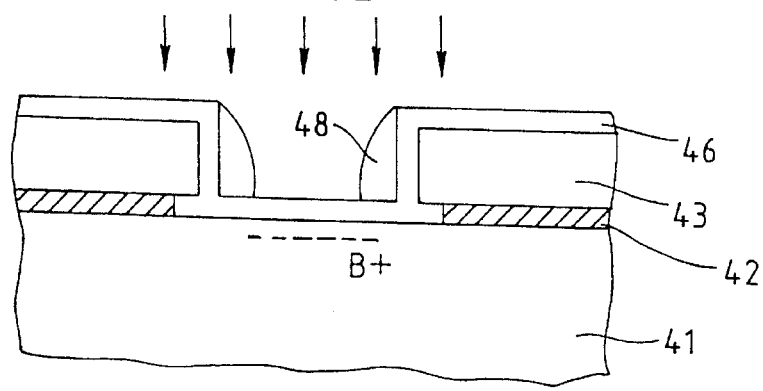

As illustrated in FIG. 4E, a first channel stop ion implantation is carried out by selecting a proper dopant and proper conditions in accordance with the type of the device such as NMOS, PMOS and the like. In the case where an NMOS transistor is to be formed in the active region, $B^+$ ions are implanted with an acceleration energy of about 40 KeV and at a concentration of about $5.0 \times 10^{13}$ ions/cm$^2$. Alternatively, this ion implantation may be skipped, and an ion implantation may be carried out after carrying out the first field oxidation.

Figure 4F:
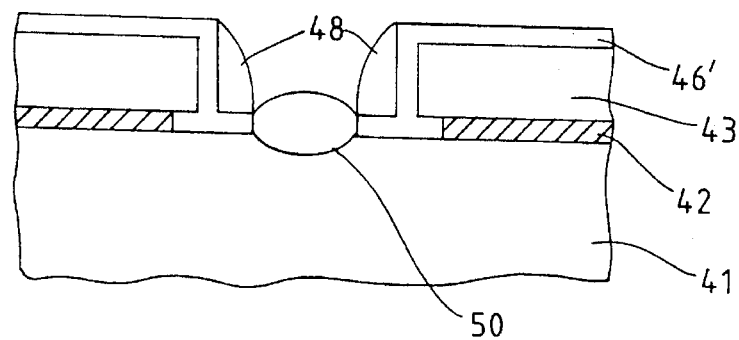

As illustrated in FIG. 4F, a first field oxidation process is carried out at a temperature of about 1000° C. and under an $H_2O_2$ atmosphere, thereby growing field oxide layer 50 to about 2500 Å. Under this condition, silicon layer 46 lying on the silicon nitride layer is oxidized, so that silicon oxide layer 46' should be formed.

Figure 4G:
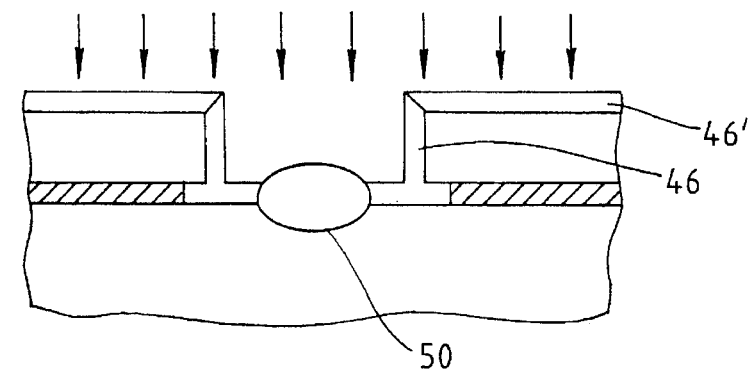

As shown in FIG. 4G, silicon nitride layer side wall 48 is removed by dipping into an $H_3PO_4$ solution. A second field channel stop ion implantation is carried out by selecting a proper dopant at proper conditions in accordance with the type of the device such as NMOS, PMOS and the like. In the case where an NMOS transistor is to be formed in the active region (i.e., substrate 41 is p-type) $B^+$ or $BF_2^+$ ions are implanted with an acceleration energy of about 40 KeV and at an ion concentration of about $3.0 \times 10^{13}$ ions/cm$^2$. If substrate 41 is n-type, the dopant for the channel stop ion implantation may be phosphorus or As ions.

Figure 4H:
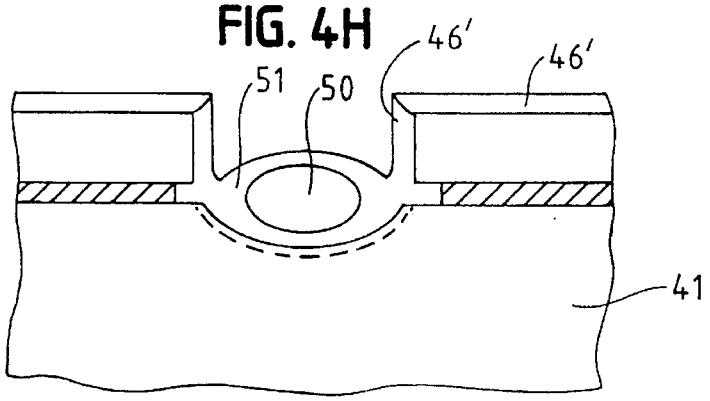
Figure 4I:
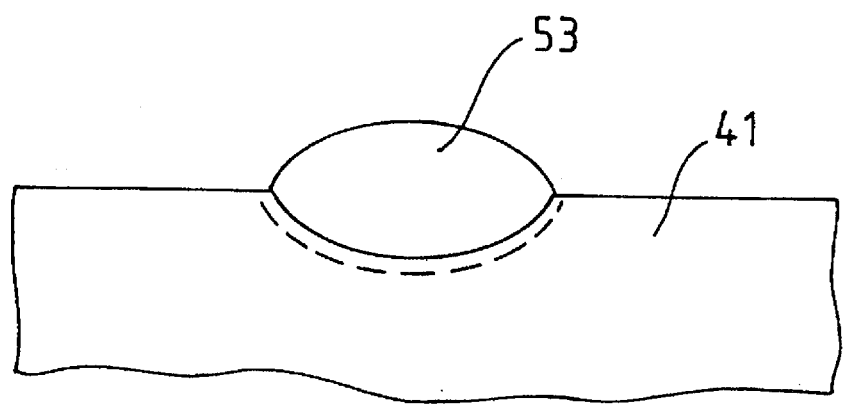

As illustrated in FIG. 4H, a second field oxidation is carried out at a temperature of about 1000° C. and under an $H_2/O_2$ atmosphere, thereby growing field oxide layer 51 to about 2500 Å. Thus, the final field oxide layer is made to have a thickness of about 5000 Å. Under this condition, silicon layer 46 which is exposed during removal of the nitride layer side wall also is oxidized, with the result that it becomes silicon oxide layer 46'.

The structure is dipped into an HF solution to remove the silicon oxide which is formed on silicon nitride layer 43. The structure then is dipped into $H_3PO_4$ having a temperature of about 180° C. to remove the silicon nitride layer. The pad oxide also is dipped into an HF solution, so that field oxide layer 53 should be formed only on the field region. In the method of the present invention, if polysilicon layer 46 (upon the nitride layer) is removed after the formation of a silicon nitride layer side wall, the dipping into a 50:1 HF solution for removing the polysilicon oxide layer after the field oxidation may be skipped.

Further, even in the case where the first field channel stop ion implantation is carried out before the first field oxidation and after the formation of the nitride layer side wall, the distance between the ion implantation region and the active region can be increased. Therefore, with the same amount of the diffusion, $\Delta W$ can be reduced as much as the originally separated distance, thereby achieving an object of the present invention.

Further, even if the first ion implantation is omitted, with only the second ion implantation carried out, an object of the present invention can be achieved, and, in this case, the method is simplified.

Further, in order to reduced the bird's beak, the $Si_3N_4$ and the stress buffer oxide between the silicon substrate are etched from the edge of the active pattern, and polysilicon is deposited, so that the active side wall should be sealed with the polysilicon, whereby the pad oxide is prevented from being exposed. Further, the field oxidation is carried out by dividing it into two stages, and the edge portion of the active region is oxidized only during the second field oxidation. Thus, the conditions for the growth of the bird's beak (such as oxidation time and the sealing of the side of the active region with polysilicon) are eliminated, thereby minimizing the length of the bird's beak. Further, the channel stop ion implantation for doping the field region is carried out after the first field oxidation, so that the dopant of the field region can be laterally diffused into the active region only during the second field oxidation, thereby minimizing $\Delta W$.

The impurity diffusion distance can be calculated approximately based on the formula $Ld=Dt^{1/2}$, where D represents a constant, and t the oxidizing time. The time t has a value equivalent to the field oxide layer obtaining time less the first field oxidation time and, therefore, it is much smaller than the conventional value. Accordingly, the diffusion distance also is reduced. Therefore, a cause of the reduction of the active region is reduced, and the characteristics of the transistor are improved. Further, the diffusion of the dopant of the field region can be reduced, and the field region is efficiently doped, so that the punch through phenomenon caused by the parasitic transistor having the field region as the channel can be controlled. Thus, the isolation property of the device is greatly improved.

According to the present invention as described above, the problems of the conventional techniques, i.e., the encroachment of the field oxide into the active region (bird's beak), and the encroachment of the doped ions of the field region into the active region, are addressed by the present invention. Consequently, various problems such as the lowering of the current driving capability due to the narrowness of the channel of the transistor, and the reduction of the switching speed due to the increase in the channel resistance and due to the variation of the VT, may be resolved, thereby greatly improving the performance of the transistor.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for forming an active region and a field region in a semiconductor device comprising the steps of:

forming a pad oxide layer and a first nitride layer on a semiconductor substrate, and defining an active region pattern by etching the pad oxide layer and the first nitride layer where the field region is to be formed;

removing a portion of the pad oxide layer underlying the first nitride layer along the edge of the active region pattern;

forming a conformal silicon layer, wherein the silicon layer fills the space where the pad oxide layer underlying the first nitride layer had been removed;

forming a second nitride layer and etching the second nitride layer to form a side wall of nitride on the vertical surface of the silicon layer adjacent the edge of the field region;

oxidizing the silicon substrate to form a first field oxide layer;

removing the side wall of nitride, and carrying out a field channel stop ion implantation; and oxidizing to form a second field oxide layer.

2. The method of claim 1, wherein the pad oxide layer underlying the first nitride layer is removed by a wet etching comprising dipping into an aqueous HF solution.

3. The method of claim 1, wherein the pad oxide layer underlying the first nitride layer is removed by a wet etching comprising dipping into an aqueous $NH_3$ solution.

4. The method of claim 1, wherein the silicon layer comprises polysilicon.

5. The method of claim 1, wherein the etching of the second nitride layer comprises reactive ion etching.

6. The method of claim 1, wherein the silicon substrate comprises an n-type silicon substrate, and wherein the dopant for the channel stop ion implantation comprises phosphorus ions or As ions.

7. The method of claim 1, wherein the silicon substrate comprises a p-type silicon substrate, and wherein the dopant for the channel stop ion implantation comprises boron ions or $BF_2^+$ ions.

8. The method of claim 1, wherein the silicon layer comprises non-crystalline silicon.

9. The method of claim 1, wherein the thicknesses of the first and second field oxide layers are unequal.

10. The method of claim 1, wherein the thicknesses of the first and second field oxide layers are about the same.

11. The method of claim 1, wherein the thickness of the first field oxide layer is greater than the thickness of the second field oxide layer.

12. The method of claim 1, wherein, after forming the side wall of nitride, a portion of the silicon layer is exposed, the method further comprising the step of removing the exposed portion of the silicon layer.

13. A method for isolating an active region from a field region in a semiconductor device comprising the steps of:

forming a pad oxide layer and a first nitride layer on a semiconductor substrate, and defining an active region pattern by selectively removing the pad oxide layer and the nitride layer where the field region is to be formed;

removing a portion of the pad oxide layer between the silicon substrate and the nitride layer along the edge of the active region pattern;

forming a conformal silicon layer, wherein the silicon layer fills the space where the pad oxide layer had been removed along the edge of the active region pattern;

forming a second nitride layer and etching the second nitride layer to form a side wall of nitride on the vertical surface of the silicon layer adjacent the edge of the field region;

carrying out a field channel stop ion implantation, and oxidizing the silicon substrate to form a first field oxide layer; and removing the side wall of nitride, and oxidizing to form a second field oxide layer.

14. The method of claim 13, wherein the pad oxide layer between the first nitride layer and the silicon substrate is removed by dipping into an aqueous HF solution.

15. The method of claim 13, wherein the pad oxide layer underlying the first nitride layer is removed by a wet etching comprising dipping into an aqueous $NH_3$ solution.

16. The method of claim 13, wherein the silicon layer comprises polysilicon.

17. The method of claim 13, wherein the etching of the second nitride layer comprises reactive ion etching.

18. The method of claim 13, wherein the silicon substrate comprises an n-type silicon substrate, and wherein the dopant for the channel stop ion implantation comprises phosphorus ions or As ions.

19. The method of claim 13, wherein the silicon substrate comprises a p-type silicon substrate, and wherein the dopant for the channel stop ion implantation comprises boron ions or $BF_2^+$ ions.

20. The method of claim 13, wherein the silicon layer comprises non-crystalline silicon.

21. The method of claim 13, wherein the thicknesses of the first and second field oxide layers are unequal.

22. The method of claim 13, wherein the thicknesses of the first and second field oxide layers are about the same.

23. The method of claim 13, wherein the thickness of the first field oxide layer is greater than the thickness of the second field oxide layer.

24. The method of claim 13, wherein, after forming the side wall of nitride, a portion of the silicon layer is exposed, the method further comprising the step of removing the exposed portion of the silicon layer.

25. A method for isolating an active region from a field region in a semiconductor device, comprising the steps of:

forming a pad oxide layer and a first nitride layer on a silicon substrate, and forming an active region pattern by removing portions of the pad oxide layer and the first nitride layer in the field region;

exposing the pad oxide layer to an etchant to etch a portion of the pad oxide layer at the edge portion of the field region, and forming a conformal polysilicon layer, wherein the polysilicon layer is formed in the etched-away portion of the pad oxide layer;

forming a nitride layer side wall on the vertical surface of the silicon layer adjacent the edge of the field region; and performing a first field oxidation to form a first field oxide layer, removing the nitride side wall layer, implanting field channel stop ions in the field region, and performing a second field oxidation to form a second field oxide layer.

* * * * *